United States Patent
Oporta et al.

(10) Patent No.: US 11,606,031 B1
(45) Date of Patent: Mar. 14, 2023

(54) POWER SUPPLY CIRCUIT WITH LOW QUIESCENT CURRENT IN BYPASS MODE

(71) Applicant: QUALCOMM Incorporated, San Diego, CA (US)

(72) Inventors: Hector Ivan Oporta, Scotts Valley, CA (US); Daragh MacGabhann, Raleigh, NC (US); Chunping Song, Palo Alto, CA (US); Yi Wang, Cupertino, CA (US); Ji Hoon Hyun, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/649,527

(22) Filed: Jan. 31, 2022

(51) Int. Cl.
  *H02M 3/158*  (2006.01)
  *H03K 19/0185* (2006.01)
  *H03K 17/0412* (2006.01)

(52) U.S. Cl.
  CPC ...... *H02M 3/158* (2013.01); *H03K 17/04123* (2013.01); *H03K 19/018521* (2013.01); *H03K 2217/0081* (2013.01)

(58) Field of Classification Search
  CPC .... H02M 3/155; H02M 3/1557; H02M 3/156; H02M 3/1566; H02M 3/158; H02M 3/1582; H02M 3/1588; H04B 2215/069
  USPC ............................................. 323/282
  See application file for complete search history.

(56) References Cited

U.S. PATENT DOCUMENTS

| | | | |
|---|---|---|---|
| 2015/0188425 A1* | 7/2015 | Chang | H02M 3/1588 323/271 |
| 2016/0218611 A1* | 7/2016 | Lollio | H03K 17/0822 |
| 2018/0131276 A1* | 5/2018 | Lin | H02M 1/096 |
| 2019/0181859 A1* | 6/2019 | Wibben | H03K 17/6871 |

* cited by examiner

*Primary Examiner* — Quan Tra
(74) *Attorney, Agent, or Firm* — Patterson & Sheridan, LLP

(57) ABSTRACT

Power supply circuit having low quiescent current for a bypass mode. One example power supply circuit generally includes a transistor; a switching node coupled to a source of the transistor; a power supply rail; a capacitor having a first terminal coupled to the power supply rail and having a second terminal coupled to the switching node; a gate driver having an output coupled to a gate of the transistor, having a first power input coupled to the power supply rail, and having a second power input coupled to the switching node; logic having a first input coupled to the first terminal of the capacitor, having a second input coupled to the second terminal of the capacitor, and having a first output; and a pullup circuit having a control input coupled to a second output of the logic and having an output coupled to the gate of the transistor.

30 Claims, 8 Drawing Sheets

POWER SUPPLY CIRCUIT WITH LOW QUIESCENT CURRENT IN BYPASS MODE

TECHNICAL FIELD

Certain aspects of the present disclosure generally relate to electronic circuits and, more particularly, to a power supply circuit having low quiescent current while operating in a bypass mode.

BACKGROUND

A voltage regulator ideally provides a constant direct current (DC) output voltage regardless of changes in load current or input voltage. Voltage regulators may be classified as linear regulators or switching regulators. While linear regulators tend to be relatively compact, many applications may benefit from the increased efficiency of a switching regulator. A linear regulator may be implemented by a low-dropout (LDO) regulator, for example. A switching regulator (also known as a "switching converter" or "switcher") may be implemented, for example, by a switched-mode power supply (SMPS), such as a buck converter, a boost converter, a buck-boost converter, or a charge pump.

For example, a buck converter is a type of SMPS typically comprising: (1) a high-side switch coupled between a relatively higher voltage rail and a switching node, (2) a low-side switch coupled between the switching node and a relatively lower voltage rail, (3) and an inductor coupled between the switching node and a load (e.g., represented by a shunt capacitive element). The high-side and low-side switches are typically implemented with transistors, although the low-side switch may alternatively be implemented with a diode.

A charge pump is a type of SMPS typically comprising at least one switching device to control the connection of a supply voltage across a load through a capacitor. In a voltage doubler (also referred to as a "multiply-by-two (X2) charge pump"), for example, the capacitor of the charge pump circuit may initially be connected across the supply, charging the capacitor to the supply voltage. The charge pump circuit may then be reconfigured to connect the capacitor in series with the supply and the load, doubling the voltage across the load. This two-stage cycle is repeated at the switching frequency for the charge pump. Charge pumps may be used to multiply or divide voltages by integer or fractional amounts, depending on the circuit topology.

Power management integrated circuits (power management ICs or PMICs) are used for managing the power scheme of a host system and may include and/or control one or more voltage regulators (e.g., buck converters and/or charge pumps). A PMIC may be used in battery-operated devices, such as mobile phones, tablets, laptops, wearables, etc., to control the flow and direction of electrical power in the devices. The PMIC may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features are discussed briefly below. After considering this discussion, and particularly after reading the section entitled "Detailed Description," one will understand how the features of this disclosure provide the advantages described herein.

Certain aspects of the present disclosure generally relate to a power supply circuit having low quiescent current while operating in a bypass mode, the low quiescent current being achieved based on a discharged boot capacitor of the power supply circuit.

Certain aspects of the present disclosure are directed to a power supply circuit. The power supply circuit generally includes a power transistor; a switching node coupled to a source of the power transistor; a power supply rail; a capacitor having a first terminal coupled to the power supply rail and having a second terminal coupled to the switching node; a gate driver having an output coupled to a gate of the power transistor, having a first power input coupled to the power supply rail, and having a second power input coupled to the switching node; logic having a first input coupled to the first terminal of the capacitor, having a second input coupled to the second terminal of the capacitor, and having a first output; and a pullup circuit having a control input coupled to a second output of the logic and having an output coupled to the gate of the power transistor.

Certain aspects of the present disclosure are directed to a battery charging circuit comprising the power supply circuit described herein. The battery charging circuit further includes an inductor having a first terminal coupled to the switching node, and a switch coupled between a second terminal of the inductor and a node for coupling to a battery.

Certain aspects of the present disclosure are directed to a method of operating a power supply circuit. The method generally includes enabling a bypass mode for the power supply circuit; in response to the enablement, discharging a capacitor coupled across power supply inputs of a gate driver for driving a gate of a power transistor; determining the capacitor has been discharged; and in response to the determination, pulling up the gate of the power transistor to turn on the power transistor and enter the bypass mode for the power supply circuit.

Certain aspects of the present disclosure are directed to a method of operating a power supply circuit. The method generally includes enabling a bypass mode for the power supply circuit; in response to the enablement, determining a capacitor coupled across power supply inputs of a gate driver for driving a gate of a power transistor is discharged; and in response to the determination, pulling up the gate of the power transistor to turn on the power transistor and enter the bypass mode for the power supply circuit.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
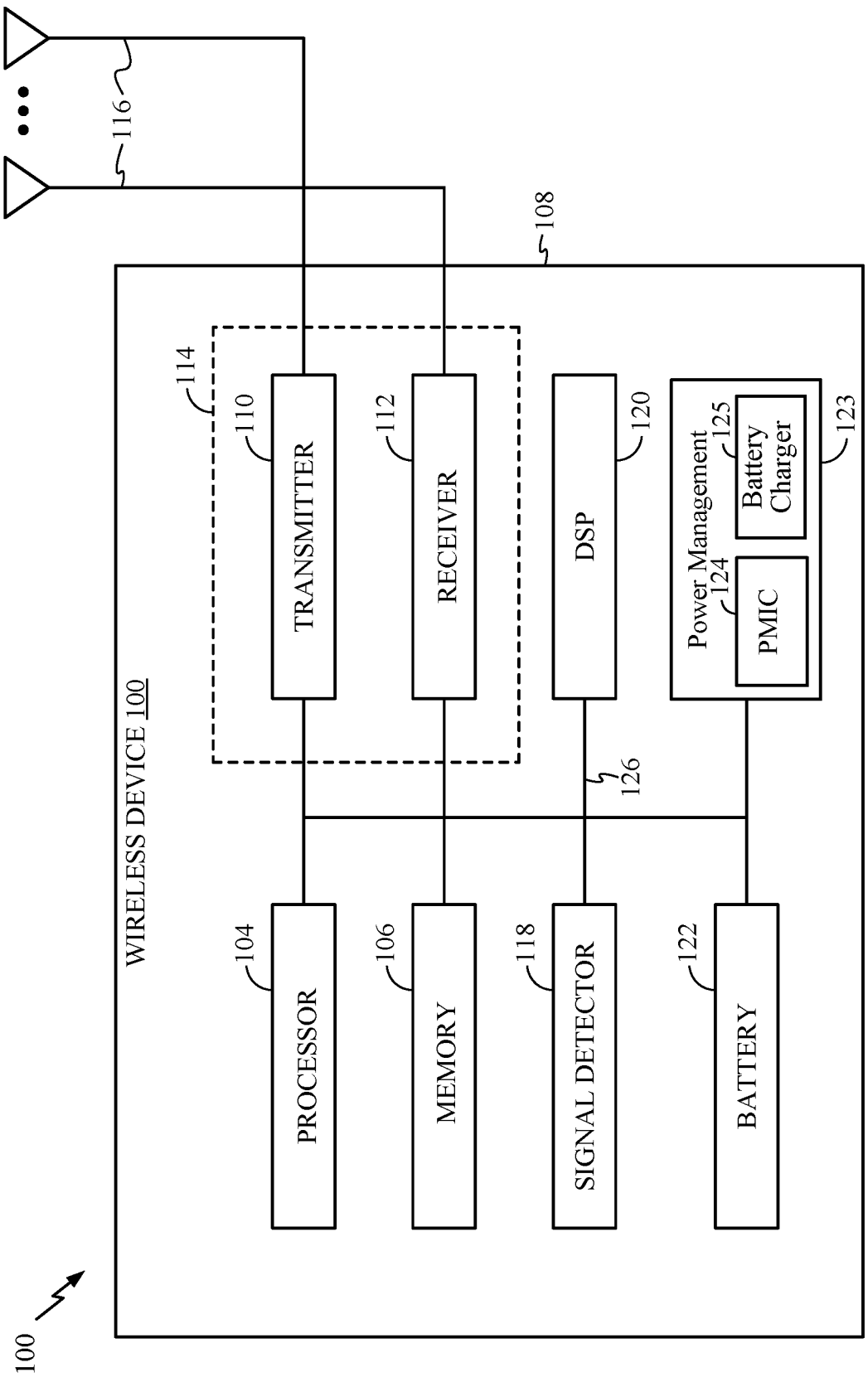
FIG. 1 is a block diagram of an example device comprising a power management system that includes a power supply circuit and a battery charging circuit, in which aspects of the present disclosure may be implemented.

Certain aspects of the present disclosure provide a power supply circuit having low quiescent current (e.g., <10 µA) while operating in a bypass mode and methods of operating such a power supply circuit. The power supply circuit may include a buck converter with a high-side power transistor, a low-side power transistor, a gate driver for each power transistor, a boot capacitor, and a pullup circuit. The low quiescent current may be achieved due to the boot capacitor being discharged. For certain aspects, the boot capacitor may be determined to have a charge when first entering the bypass mode, and in such cases, the power supply circuit may discharge the boot capacitor before entrance into the bypass mode is completed. In other aspects, the boot capacitor may be determined to be discharged already when entering the bypass mode. In either scenario, the power supply circuit may also cause: (1) an output of the gate driver for the high-side power transistor to enter a high impedance state and (2) the gate of the high-side power transistor to be pulled up with the pullup circuit to turn on the high-side power transistor without using the gate driver.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCS), personal digital assistants (PDAs), and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122, which may be used to power the various components of the device 100 (e.g., when another power source—such as a wall adapter or a wireless power charger—is unavailable). The battery 122 may comprise a single cell or multiple cells connected in series. The device 100 may also include a power management system 123 for managing the power from the battery 122, a wall adapter, and/or a wireless power charger to the various components of the device 100. The power management system 123 may perform a variety of functions for the device such as DC-to-DC conversion, battery charging, power-source selection, voltage scaling, power sequencing, etc. In certain aspects, the power management system 123 may include a power management integrated circuit (power management IC or PMIC) 124 and one or more power supply circuits, such as a battery charger 125, which may be controlled by the PMIC. For certain aspects, at least a portion of one or more of the power supply circuits may be integrated in the PMIC 124. The PMIC 124 and the one or more power supply circuits may include at least a portion of a switched-mode power supply (SMPS) circuit, which may be implemented by any of various suitable SMPS circuit topologies, such as a buck converter, a buck-boost converter, a three-level buck converter, or a charge pump, such as a multiply-by-two (X2) or multiply-by-three (X3) charge pump.

The various components of the device 100 may be coupled together by a bus system 126, which may include a power bus, a control signal bus, and/or a status signal bus in addition to a data bus.

Example Battery Charging Circuit

Figure 2:
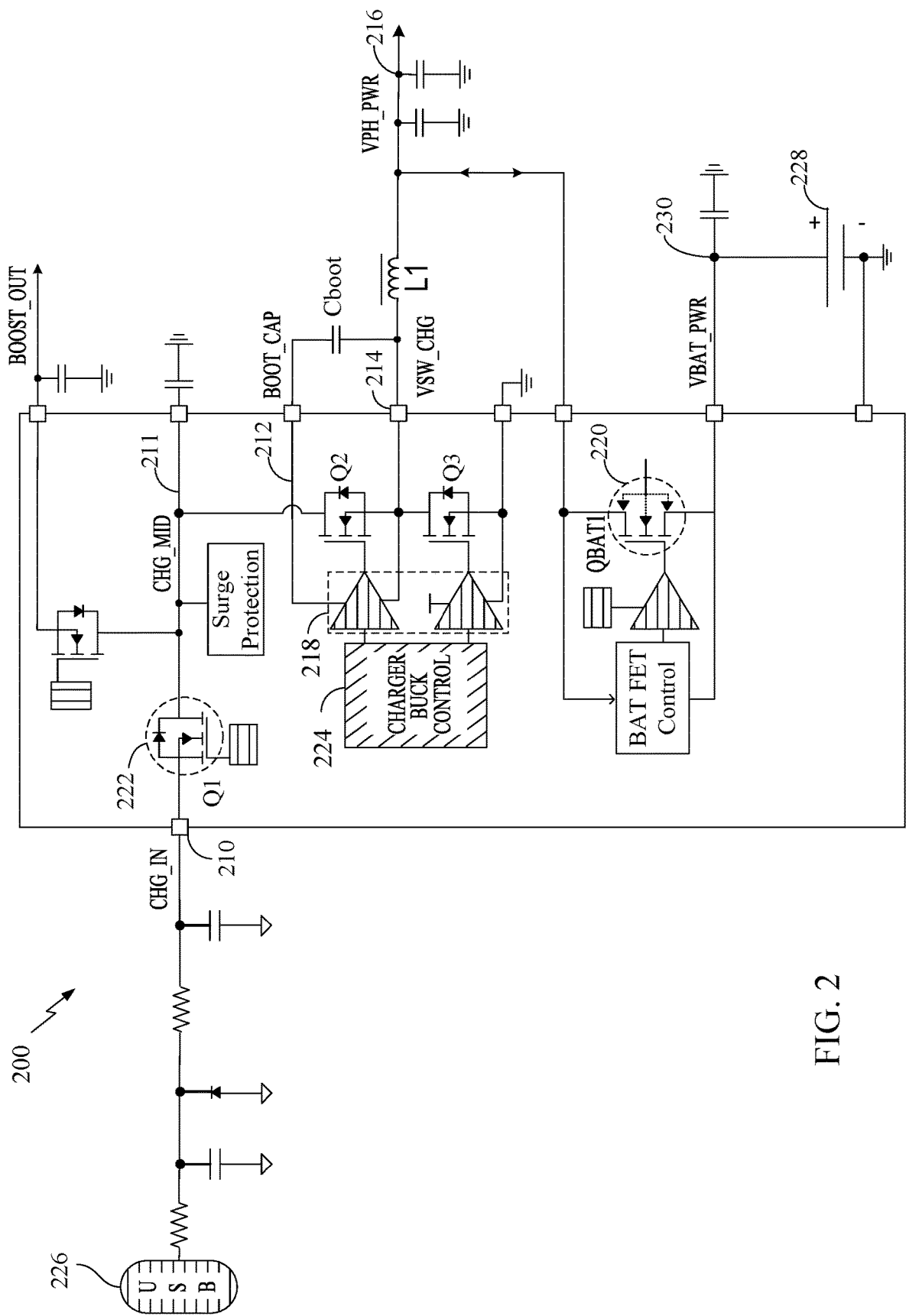
FIG. 2 is a schematic diagram of an example power supply circuit, in which aspects of the present disclosure may be implemented.

FIG. 2 is a schematic diagram of an example battery charging circuit 200. The battery charging circuit 200 may include a switched-mode power supply (SMPS), gate drivers 218, a battery switch 220 (e.g., transistor QBAT1, also referred to as a "battery transistor" or a "BAT FET"), a reverse-blocking transistor 222 (labeled "Q1"), and control logic 224. The battery charging circuit 200 may receive power at an input power node 210 (labeled "CHG_IN" for charger input node) from one of multiple potential power sources, such as a wall adapter or other power cable (e.g., a Universal Serial Bus (USB) adapter) connected via USB port 226 or a wireless power charger (not shown).

The SMPS may be implemented by any of various suitable switching regulators, such as a two-level buck converter (as illustrated in FIG. 2 with transistors Q2 and Q3 and inductor L1) or a three-level buck converter. The SMPS may receive power via the input power node 210 at a power supply rail 211 (labeled "CHG_MID") coupled between the reverse-blocking transistor 222 and the drain of the transistor Q2. The SMPS may have a switching node 214 (labeled "VSW_CHG") coupled to a source of the transistor Q2 (also referred to as the "high-side transistor"), a drain of the transistor Q3 (also referred to as the "low-side transistor"), and a first terminal of the inductor L1. Another power supply rail 212 (labeled "BOOT_CAP") may have a power supply voltage generated internally (e.g., from the CHG_MID rail). The power supply voltage of the power supply rail 212 may be limited (e.g., BOOT_CAP—VSW_CHG≤5 V). A capacitor Cboot may be coupled between the power supply rail 212 and the switching node 214. The output of the SMPS at a system power node 216 (labeled "VPH_PWR" and coupled to a second terminal of the inductor L1) may provide power to one or more core PMICs (not shown) and/or other circuits within a device (e.g., device 100). As shown, the battery switch 220 may be coupled between the system power node 216 and a node 230 (labeled "VBAT_PWR") for coupling to a battery 228. The battery switch 220 may be driven by a gate driver, which may be controlled by BAT FET control logic, as shown. For certain aspects, the BAT FET control logic may be part of the control logic 224.

Figure 3A:
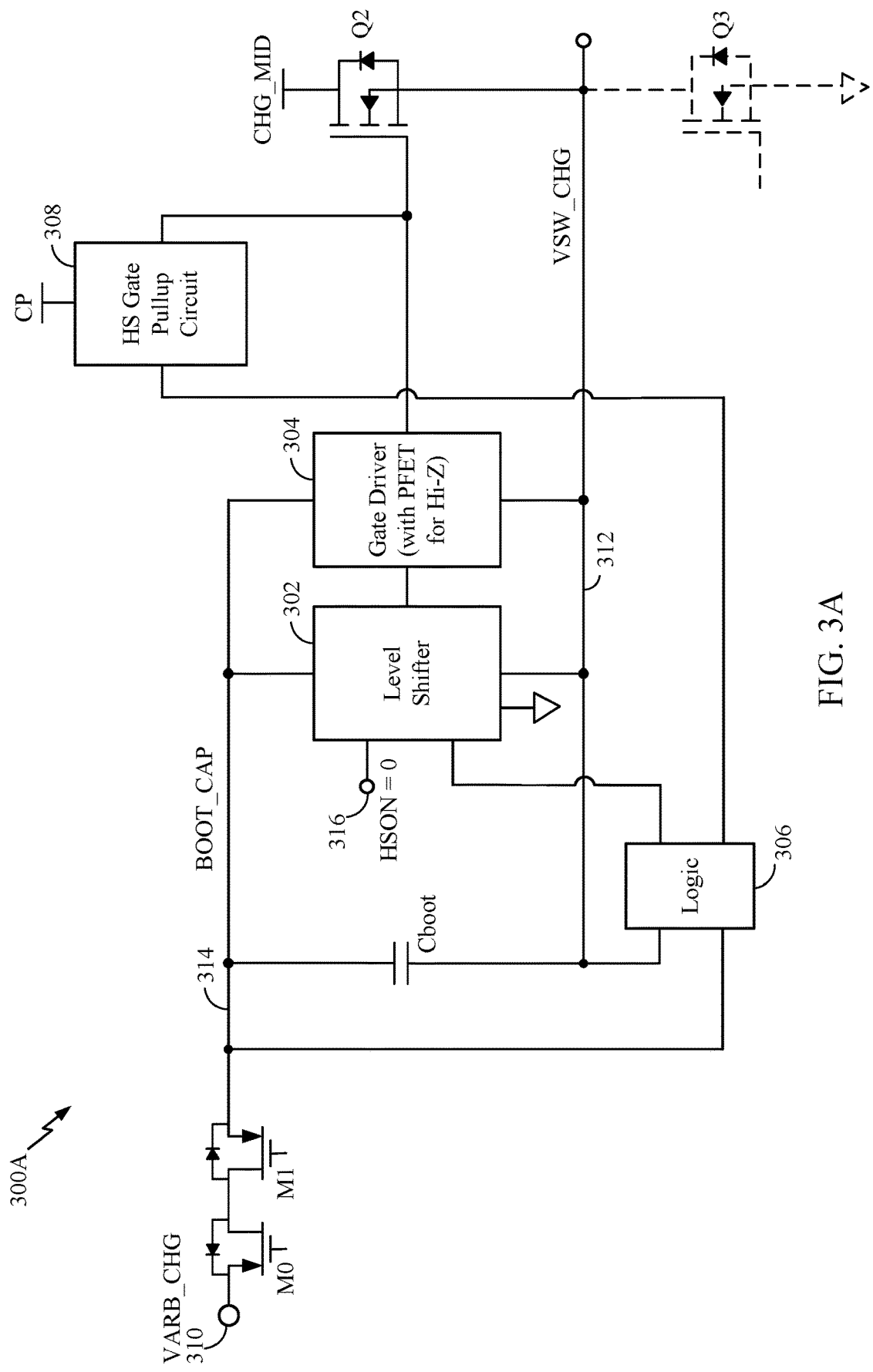
FIG. 3A is a block diagram of an example power supply circuit capable of operating in a bypass mode with low quiescent current using a level shifter to discharge a boot capacitor, in accordance with certain aspects of the present disclosure.
Figure 4:
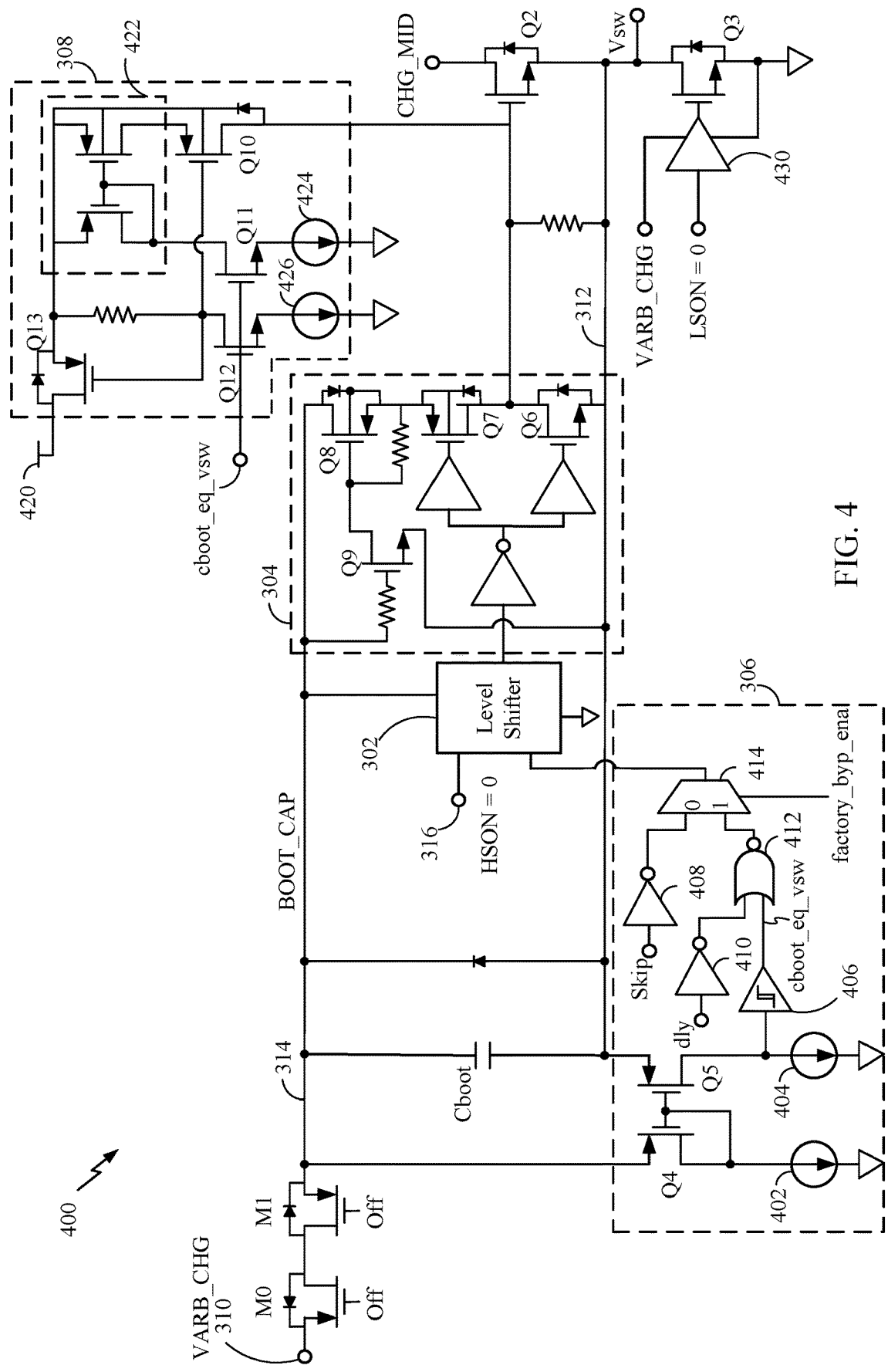
FIG. 4 is a schematic diagram of the power supply circuit of FIG. 3A, in accordance with certain aspects of the present disclosure.

The control logic 224 may include a level shifter and other logic, which may control a pullup circuit (discussed further with respect to FIGS. 3A and 4). The control logic 224 may control the gate drivers 218, which may drive the gates of the power transistors Q2 and Q3 implementing the SMPS. The control logic 224 may also control the reverse-blocking transistor 222, the battery switch 220, and other components. It may be desirable to operate the battery charging circuit 200 in a "bypass mode" as described below, such as in a factory where a device (e.g., device 100) with the battery charging circuit 200 is manufactured. For example, when the battery charging circuit 200 is operating in the bypass mode, the control logic 224 may turn off the battery switch 220 and the transistor Q3 and turn on the reverse-blocking transistor 222 and the transistor Q2, such that current flows from the input power node 210 to the system power node 216, and not to the battery 228.

Example Power Supply Circuit With Low Quiescent Current in Bypass Mode

Manufacturers of devices with battery charging circuits and other power supply circuits may test for current leakage and sleep currents in the power supply circuits. For testing, the devices may be placed in a "bypass mode." While the device is in the bypass mode, the input power node 210 is connected to the system power node 216, effectively providing direct power from the input power node to the system power node and bypassing the SMPS. Thus, a reverse-blocking transistor (e.g., reverse-blocking transistor 222) and a high-side power transistor (e.g., power transistor Q2) may be fully turned on in order to apply a power supply voltage (e.g., a Universal Serial Bus (USB) voltage, referred to as "VBUS") at an input power node (e.g., input power node 210) to an internal device power node (e.g., system power node 216), allowing manufacturers to measure current leakage in the power supply circuits in the factory. Current consumed by the power supply circuit itself during bypass mode testing may provide a source of error in the current leakage measurement for the device. Accordingly, bypass mode specifications may call for the device to have a relatively small quiescent current (e.g., <10 µA) when in the bypass mode, in order to minimize (or at least reduce) the current consumption of the power supply circuit during testing.

The reverse-blocking transistor is not a switching transistor, and its gate drive may be simpler with less circuit connections (so less current consumption) than that of the high-side power transistor. Therefore, the reverse-blocking transistor may pose less of a challenge for meeting the specified quiescent current. In contrast, when the high-side power transistor is turned on in the bypass mode, other components (e.g., components connected through the boot capacitor Cboot) may draw additional current, thereby increasing the total quiescent current of the device. One approach to meeting the specified quiescent current involves current reduction of individual components coupled to the high-side power transistor. However, this approach may introduce circuit complexity, may consume more circuit area, and/or may negatively affect the performance of the power supply circuit in a mission mode (e.g., normal operation outside of the bypass mode or other testing modes). Therefore, alternative techniques for reducing the quiescent current of a device operating in the bypass mode may be desirable.

Accordingly, certain aspects of the present disclosure provide apparatus and techniques for reducing the quiescent current of a device operating in the bypass mode by discharging the capacitor Cboot prior to entering the bypass mode (or by determining that the capacitor Cboot has already been discharged). By discharging the capacitor Cboot, the current draw from the capacitor Cboot (and components connected to the capacitor) may be eliminated (or at least reduced). In some aspects, existing circuitry in the device may be utilized to implement the techniques presented herein.

FIG. 3A is a block diagram of an example power supply circuit 300A capable of operating in a bypass mode with low quiescent current (e.g., <10 µA), in accordance with certain aspects of the present disclosure. The power supply circuit 300A may generally include back-to-back transistors M0 and M1, a power transistor Q2, a capacitor Cboot, a level shifter 302, a gate driver 304, logic 306, and a pullup circuit 308, among other components (e.g., components of the battery charging circuit of FIG. 2).

The power supply circuit 300A may have a power node 310 (labeled "VARB_CHG") coupled to a source of the transistor M0, which may be an n-type transistor, as shown. In some cases, the voltage on the power node 310 may be internally generated and may have a limited voltage. A drain of transistor M0 may be coupled to a drain of transistor M1, as shown. The power supply circuit 300A may also include a power supply rail 314 and a switching node 214. The power supply rail 314 (labeled "BOOT_CAP" and analogous to the power supply rail 212 in FIG. 2) is coupled to a source of the transistor M1. In this manner, the back-to-back transistors M0 and M1 are coupled between the power node 310 and the power supply rail 314. The switching node 312 (labeled "VSW_CHG" and analogous to switching node 214 in FIG. 2) is coupled to a source of the power transistor Q2. A drain of the power transistor Q2 may be coupled to another power supply rail 211 (labeled "CHG_MID"), which may have a higher voltage than the power supply rail 314 in some cases. The power transistor Q2 may be referred to as the "high side" or "HS" transistor.

An output of the power supply circuit 300A may be coupled to the switching node 312 (e.g., through inductor L1, not shown in FIG. 3A). The power supply circuit 300A may also include a "low side" or "LS" transistor Q3, having a drain coupled to the switching node 312 and a source coupled to a reference potential node (e.g., electrical ground) for the power supply circuit 300A.

As illustrated in FIG. 3A, the capacitor Cboot may have a first terminal coupled to the power supply rail 314 and a second terminal coupled to the switching node 312. The gate driver 304 may have an output coupled to a gate of the power transistor Q2, a first power input coupled to the power supply rail 314, and a second power input coupled to the switching node 312. In certain aspects, the gate driver 304 may include a p-type transistor (e.g., a PFET) to put the output of the gate driver 304 in a high impedance state when the capacitor Cboot is discharged (as explained below with respect to FIG. 4).

The logic 306 may have a first input coupled to the first terminal of the capacitor Cboot, a second input coupled to the second terminal of the capacitor Cboot, and one or more outputs. In FIG. 3A, the logic 306 has one output coupled to a control input of the pullup circuit 308 and another output coupled to a control input of the level shifter 302. For certain aspects, the logic 306 may be part of control logic (e.g., control logic 224 in FIG. 2) for controlling the operation of the power transistors Q2 and Q3 (e.g., using the level shifter 302 and the gate driver 304). For other aspects, the logic 306 may be external to the control logic, but may be communicatively coupled with the control logic.

The pullup circuit 308 may also have an output coupled to the gate of the power transistor Q2 and have a power supply input coupled to another power supply rail (labeled "CP" for charge pump) configured to have a higher voltage than the power supply rail 314 (e.g., 5 V higher than the battery voltage, where this higher voltage may be generated with a multiplying charge pump). The pullup circuit 308 may be referred to as a "HS gate pullup circuit" because this pullup circuit may be configured to pull up the voltage at the gate of the HS power transistor Q2, thereby turning the power transistor Q2 on.

The level shifter 302 may have a signal input 316 (labeled "HSON" for the high-side transistor on signal), a control input (coupled to an output of the logic 306), an output coupled to an input of the gate driver 304, a first power input coupled to the power supply rail 314, and a second power input coupled to the switching node 312. The signal input 316 may be used to control the state of the power transistor Q2 during normal operations, where "HSON=0" indicates that the signal input 316 is logic low during the bypass mode. Also during the bypass mode, for certain aspects, the logic 306 may be configured to control the level shifter 302 (via the control input to the level shifter) to discharge the capacitor Cboot (e.g., via a current sink or other path to ground, internal to the level shifter) and to enable the pullup circuit 308 (via the control input to the pullup circuit) to output a voltage to turn on the power transistor Q2, in response to the capacitor Cboot being discharged. Additionally when the capacitor Cboot is discharged in the bypass mode, the output of the gate driver 304 may be placed in a high impedance state (e.g., via transistor logic as shown in FIG. 4 or via another output from the logic 306).

In certain aspects, the logic 306 may be further configured to turn on the reverse-blocking transistor Q1 (in addition to controlling the pullup circuit 308 to turn on the power transistor Q2 during the bypass mode), such that the input power node 210 is effectively shorted to the switching node 312 (and to the output of the power supply circuit 300A, via the inductor L1).

FIG. 4 is a schematic diagram of an example power supply circuit 400, implementing the power supply circuit 300A of FIG. 3A. The power supply circuit 400 may include back-to-back transistors M0 and M1, a power transistor Q2, a capacitor Cboot, a level shifter 302, a gate driver 304, logic 306, and a pullup circuit 308, as described above with respect to FIG. 3A.

According to certain aspects, the gate driver 304 may include a first n-type transistor Q6 having a drain coupled to the output of the gate driver 304 and having a source coupled to the second power input of the gate driver 304, a first p-type transistor Q7 having a drain coupled to the output of the gate driver 304 and to the drain of the first n-type transistor Q6, and a second p-type transistor Q8 having a source coupled to a source of the first p-type transistor Q7 and having a drain coupled to the first power input of the gate driver 304. In certain aspects, the second p-type transistor Q8 may be configured to be turned off when the capacitor Cboot is discharged and effectively put the output of the gate driver 304 in a high impedance state.

According to certain aspects and as shown in FIG. 4, the gate driver 304 may further include a second n-type transistor Q9. The second n-type transistor Q9 may have a drain coupled to a gate of the second p-type transistor Q8, have a gate coupled to the power supply rail 314 (e.g., via a resistor), and have a source coupled to the switching node 312.

According to certain aspects, the logic 306 may include a comparator having a first input coupled to the first terminal of the capacitor Cboot and having a second input coupled to the second terminal of the capacitor Cboot. In certain aspects, the logic 306 may be configured to activate an output signal in response to the capacitor Cboot being discharged. In certain aspects, the logic 306 may be further configured to enable the pullup circuit 308 to output a voltage to turn on the power transistor Q2, based on the activated output signal.

In certain aspects, the comparator may include a Schmitt trigger 406. In this case, the comparator may also include transistors Q4 and Q5 and current sinks 402, 404. The transistor Q4 may have a source coupled to the first terminal of the capacitor Cboot and have a drain coupled to a gate of the transistor Q4. The current sink 402 may be coupled between the drain of the first transistor Q4 and a reference potential node (e.g., electrical ground) for the power supply circuit 400. The transistor Q5 may have a source coupled to the second terminal of the capacitor Cboot, have a gate coupled to the gate and the drain of the transistor Q4, and have a drain coupled to an input of the Schmitt trigger 406. The current sink 404 may be coupled between the drain of the transistor Q5 and the reference potential node.

In some aspects, the logic 306 may include additional circuitry, such as inverters 408 and 410, a logic NOR gate 412, and a multiplexer 414.

The inverter 408 may have an input (labeled "Skip") which may indicate whether a pulse-skipping mode is enabled or disabled for the power supply circuit 400. The inverter 410 may have an input (labeled "dly" but also referred to as "factory_byp_ena_dly"), which provides a delayed version of a control signal (labeled "factory_byp_ena") indicating that a factory bypass mode is enabled. The delay may provide time for the logic 306 to determine that the capacitor Cboot has discharged before the logic 306 indicates for the pullup circuit 308 to turn on the power transistor Q2. The NOR gate 412 may have a first input coupled to the output of the inverter 410 and a second input coupled to the output of the Schmitt trigger 406, as shown.

The multiplexer 414 may have a first input coupled to the output of the inverter 408 and a second input coupled to the output of the NOR gate 412. The multiplexer 414 may also have a control input (labeled "factory_byp_ena") which indicates whether a factory bypass mode is enabled and selects between the first and second inputs of the multiplexer 414. The second input of the multiplexer 414 will be high when the factory_byp_ena signal is high (e.g., logic 1) and when the output of the Schmitt trigger 406 is low (e.g., logic 0). Otherwise, the second input of the multiplexer 414 will be low. The output of the Schmitt trigger 406 will be low when the capacitor Cboot is not discharged (e.g., when the voltage of the capacitor Cboot is greater than the voltage at the switching node 312). The output signal of the multiplexer 414 may serve as a control input to the level shifter 302. For example, the multiplexer 414 may output a high signal to indicate to the level shifter 302 to discharge the capacitor Cboot (e.g., act as a current sink).

According to certain aspects, the pullup circuit 308 may have a power supply input coupled to another power supply rail 420 configured to have a higher voltage than the power supply rail 314 (e.g., 5 V higher than the battery voltage Vbat). In certain aspects, this higher voltage of the other power supply rail 420 may be generated by a charge pump circuit (e.g., a multiplying charge pump). As shown, the pullup circuit 308 may include a current mirror 422, transistors Q10, Q11, and Q12, and current sinks 424, 426. The current mirror 422 may have a first branch and a second branch, where the first branch and the second branch are coupled to the power supply input of the pullup circuit 308. The transistor Q10 may have a source coupled to the second branch of the current mirror 422 and have a drain coupled to the output of the pullup circuit 308. The transistor Q11 may have a drain coupled to the first branch of the current mirror 422 and have a gate coupled to the control input of the pullup circuit 308. The current sink 424 may be coupled between a source of the transistor Q11 and a reference potential node for the power supply circuit (e.g., electrical ground). The transistor Q12 may have a drain coupled to a gate of the transistor Q10 and have a gate coupled to the control input (labeled "cboot_eq_vsw") of the pullup circuit 308. The current sink 426 may be coupled between a source of the third transistor Q12 and the reference potential node for the power supply circuit 400. The control input of the pullup circuit 308 may be coupled to an output of the logic 306 (e.g., "cboot_eq_vsw" at the output of the Schmitt trigger 406).

In certain aspects, the pullup circuit 308 may also include another transistor Q13, which may be an n-type transistor. The transistor Q13 may have a drain coupled to the power supply input of the pullup circuit 308, have a source coupled to the first branch and the second branch of the current mirror 422, and have a gate coupled to the gate of the transistor Q10 and the drain of the transistor Q12.

The power supply circuit 400 may include a low-side transistor Q3, having a drain coupled to the switching node 312 and a source coupled to electrical ground, as shown. The low-side transistor Q3 may have a gate coupled to an output of a gate driver 430. The gate driver 430 may have a first power supply input (labeled "VARB_CHG" and coupled to the power node 310), a second power supply input (coupled to electrical ground), and a signal input (labeled "LSON"). The signal input being equal to logic 0 ("LSON=0") in FIG. 4 indicates that the low-side transistor Q3 is off during the bypass mode. Furthermore, the back-to-back transistors M0 and M1 may be turned off during the bypass mode (as indicated by "Off" at the gates of transistors M0 and M1 in FIG. 4), such that the power supply rail 314 does not receive power from the internal power source (e.g., VARB_CHG) and the capacitor Cboot can be discharged.

Figure 5:
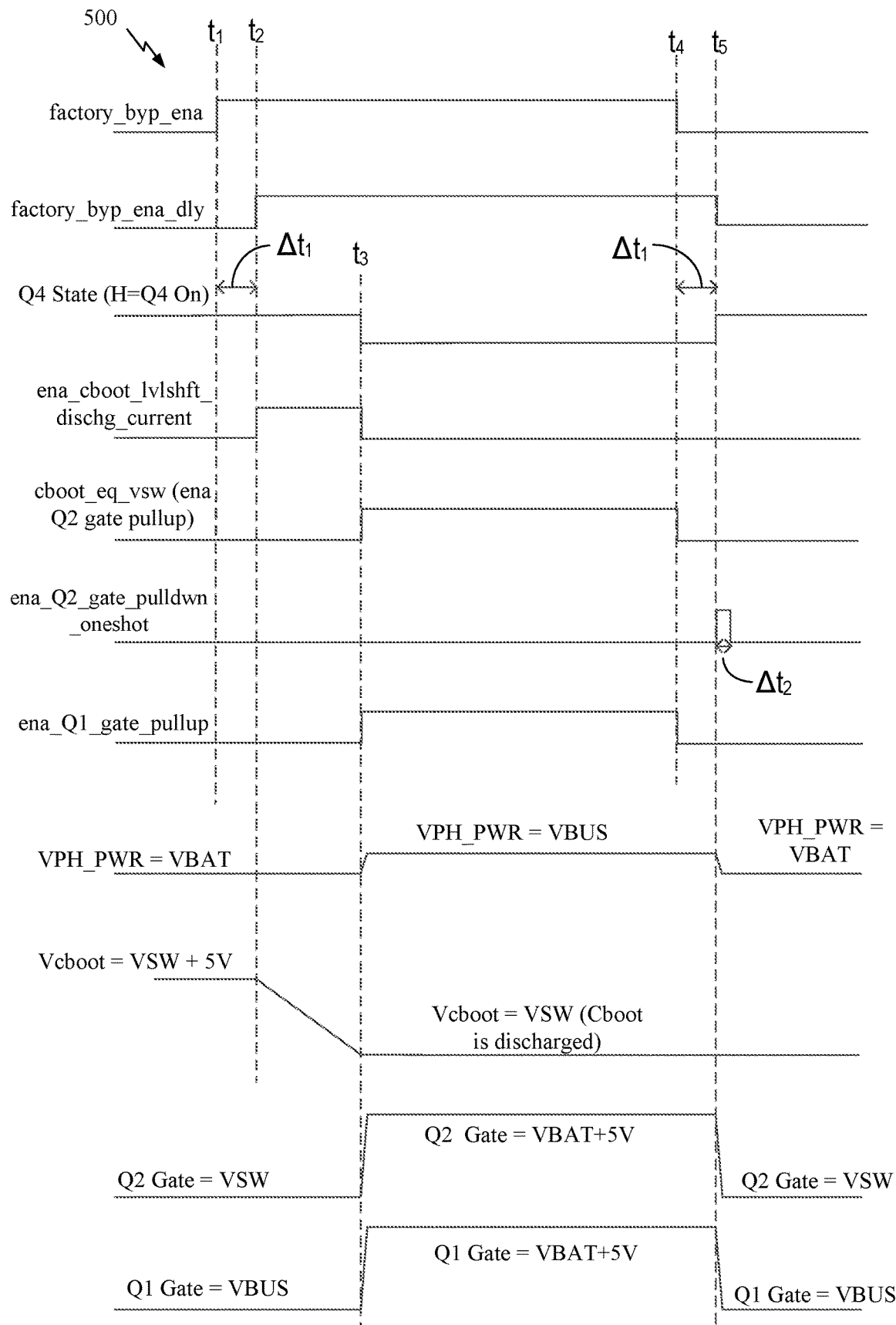
FIG. 5 is a timing diagram illustrating the power supply circuit of FIG. 4 entering, operating in, and exiting a bypass mode, in accordance with certain aspects of the present disclosure.

FIG. 5 is a timing diagram 500 illustrating the power supply circuit 400 of FIG. 4 entering, operating in, and exiting a bypass mode, in accordance with certain aspects of the present disclosure.

Before the power supply circuit 400 has entered the bypass mode, the capacitor Cboot may have a nonzero voltage (e.g., "Vcboot"), which may, for example, be equal to the switching voltage Vsw plus 5 V, as shown. At time $t_1$, the factory bypass mode enabling signal "factory_byp_ena" may transition from low (e.g., logic 0) to high (e.g., logic 1), indicating that the power supply circuit 400 has enabled the factory bypass mode. For certain aspects, after a delay time $\Delta t_1$ (e.g., 20 μs), the signal "factory_byp_ena_dly" (e.g., a delayed version of the factory bypass mode enabling signal) may transition from low to high at time $t_2$. The delay may provide time for the logic 306 to determine that the capacitor Cboot has discharged (e.g., has a voltage equal to Vsw, or at least where the difference between the voltages is less than a threshold) before the logic 306 indicates for the pullup circuit 308 to turn on the power transistor Q2.

At time $t_2$, the signal "ena_cboot_lvlshift_disch_current" may transition from low to high, indicating to the level shifter 302 (or another current sink circuit) to discharge the capacitor Cboot. As shown, in response to the transition of the signal "ena_cboot_lvlshift_disch_current," the voltage of the capacitor Cboot begins to decrease from Vsw plus 5 V to Vsw as the capacitor Cboot discharges. However, in other examples, the logic 306 may determine that the capacitor Cboot is already discharged. In this case, the signal "ena_cboot_lvlshift_disch_current" may not transition from low to high.

At time $t_3$, when the capacitor Cboot has been discharged, the output of the gate driver 304 may enter the high impedance state, and the signal "Q4 State (H=Q4 On)" may transition from high to low, causing the comparator output to change state, indicate the capacitor Cboot has been discharged, and control multiple components to set up for and enter the bypass mode. Thus, at time $t_3$, the signal "cboot_eq_vsw" may transition from low to high, which may cause the power supply circuit 400 to enable the pullup circuit 308 to pull up the voltage at the gate of the power transistor Q2 and may cause the signal "ena_cboot_lvlshift_disch_current" to transition from high to low, ending the discharge of the capacitor Cboot. Furthermore, at time $t_3$, the power supply circuit 400 may, by causing the signal "ena_Q1_gate_pullup" to transition from low to high, indicate for the voltage at the gate of the reverse-blocking transistor Q1 to be pulled up, thereby turning on the transistor Q1.

Accordingly, as illustrated by the bottom two signals of the timing diagram 500, upon entering the bypass mode at time $t_3$, the voltages at the gate of the reverse-blocking transistor Q1 and the gate of the power transistor Q2 begin to ramp up. The voltages at the gate of the reverse-blocking transistor Q1 and the gate of the power transistor Q2 may ramp up until the voltages reach a predefined voltage (e.g., the battery voltage VBAT plus 5 V). Also at time $t_3$, a voltage labeled "VPH_PWR" at the system power node (e.g., system power node 216 in FIG. 2) may transition from the battery voltage (e.g., VBAT) to a USB voltage labeled "VBUS" (e.g., from the input power node 210 in FIG. 2).

At time $t_4$, the signal "factory_byp_ena" may transition from high to low, indicating that the power supply circuit 400 has disabled the bypass mode. At time $t_4$, because the power supply circuit 400 has indicated that the bypass mode has been disabled, the signal "cboot_eq_vsw" may transition from high to low, indicating to the pullup circuit 308 to stop pulling up the voltage at the gate of the power transistor Q2. Also at time $t_4$, the signal "ena_Q1_gate_pullup" may transition from high to low, indicating to the power supply circuit 400 to stop pulling up the voltage at the gate of the reverse-blocking transistor Q1.

After a delay time $\Delta t_1$, the signal "factory_byp_ena_dly" (e.g., the delayed version of the factory bypass mode enabling signal) may transition from high to low at time $t_5$. Also at time $t_5$, the signal "Q4 State (H=Q4 On)" may transition from low to high, indicating that the power supply circuit 400 is no longer operating in the bypass mode.

In certain aspects, at time $t_5$, a signal "ena_Q2_gate_pulldown_oneshot" may transition from low to high. After a time $\Delta t_2$, the signal "ena_Q2_gate_pulldown_oneshot" may transition from high to low, such that this signal is a pulse. The signal "ena_Q2_gate_pulldown_oneshot" may indicate for a pulldown circuit to quickly pull down the voltage at the gate of the power transistor Q2, thereby turning it off. As shown, at time $t_5$, the voltages at the gate of the reverse-blocking transistor Q1 and the gate of the power transistor Q2 may decrease to the voltage levels of the gates prior to the power supply circuit 400 entering the bypass mode. Additionally, the voltage at system power node (e.g., system power node 216) may transition from the USB voltage (e.g., at the input power node 210 in FIG. 2) to the battery voltage (e.g., VBAT).

Figure 3B:
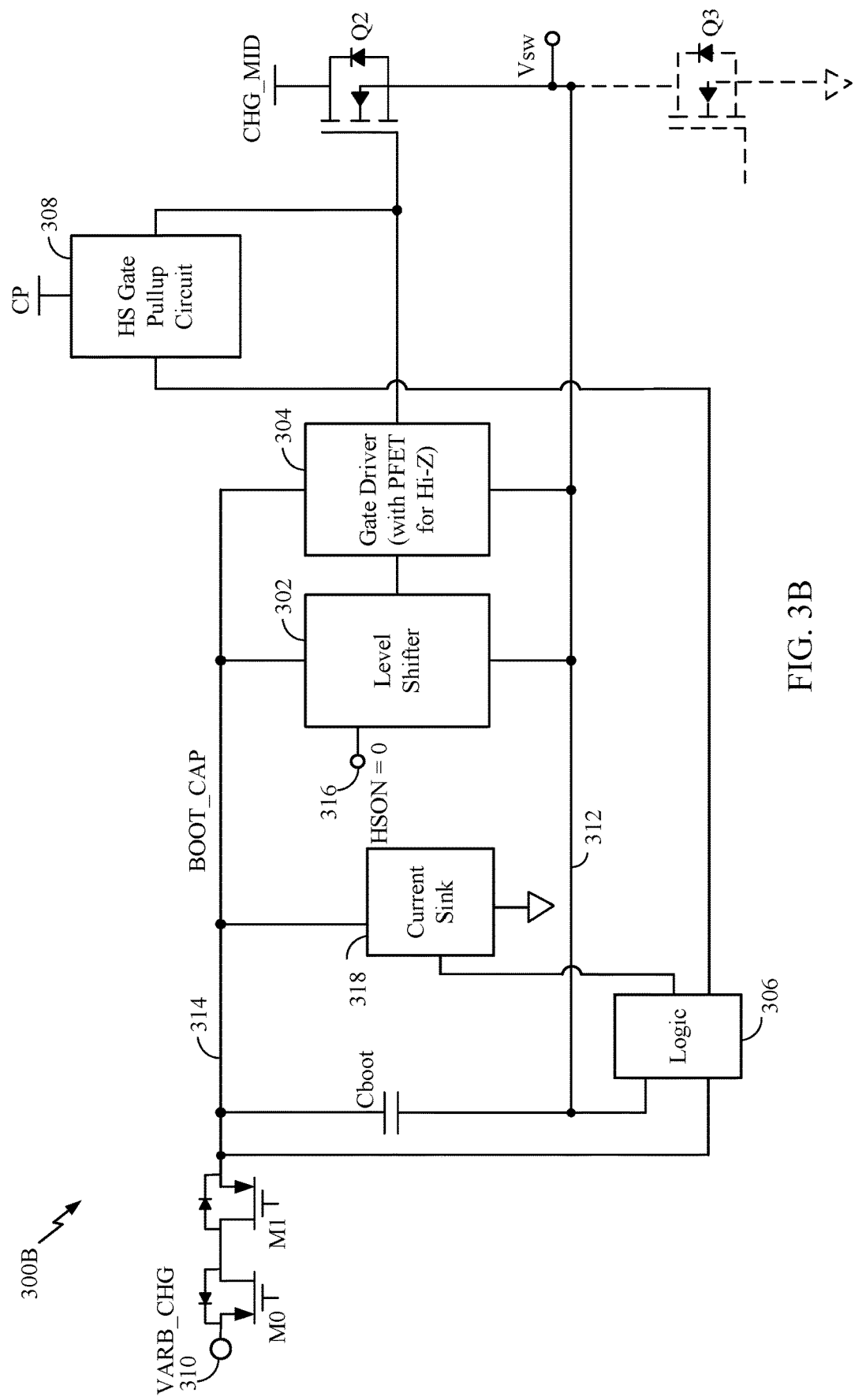
FIG. 3B is a block diagram of an example power supply circuit capable of operating in a bypass mode with low quiescent current, the power supply circuit having a current sink to discharge a boot capacitor, in accordance with certain aspects of the present disclosure.

FIG. 3B is a block diagram of an example power supply circuit 300B capable of operating in a bypass mode with reduced current with additional current sink circuitry, in accordance with certain aspects of the present disclosure. The power supply circuit 300B may be similar to the power supply circuit 300A in FIG. 3A, but with a current sink 318 separate from the level shifter 302.

In certain aspects, the level shifter 302 may include a current sink and may be configured to discharge the capacitor Cboot via the current sink when the control input of the level shifter 302 is activated by the logic 306. However, in certain other aspects, the current sink 318 may be an additional current sink separate from the level shifter 302, as shown. In this case, the current sink 318 may be selectively coupled to the first terminal of the capacitor Cboot (or otherwise effectively selectively enabled). Additionally, during a bypass mode, the logic 306 may be configured to effectively enable the current sink 318, via the first output of the logic 306, to discharge the capacitor Cboot and to enable the pullup circuit 308 to output a voltage to turn on the power transistor Q2, in response to the capacitor Cboot being discharged.

Example Operations

Figure 6:
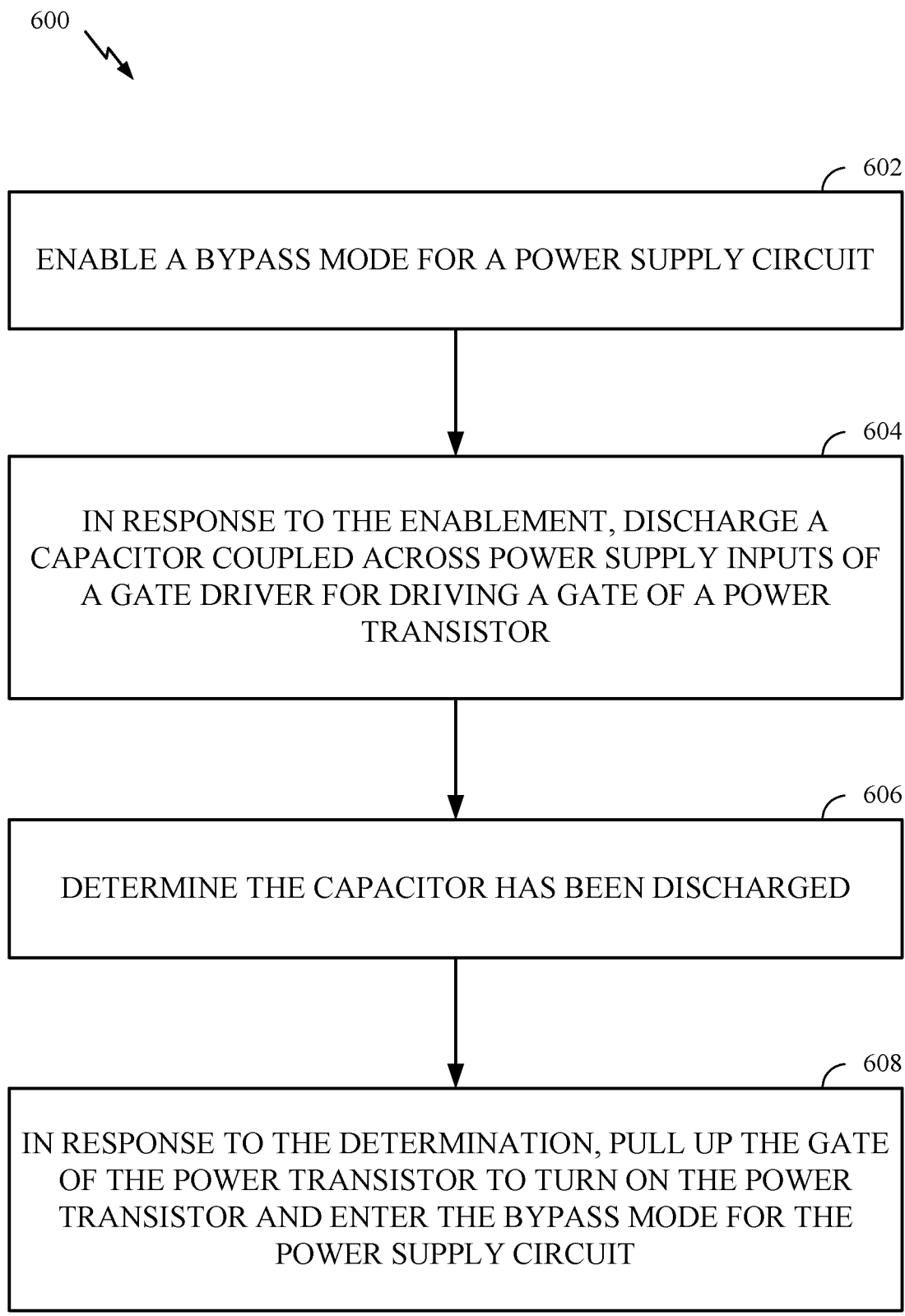
FIGS. 6 and 7 are flow diagrams of example operations for operating a power supply circuit, in accordance with certain aspects of the present disclosure.

FIG. 6 is a flow diagram of example operations 600 for operating a power supply circuit, in accordance with certain aspects of the present disclosure. The operations 600 may be performed by a power supply circuit (e.g., the power supply circuit 300A of FIG. 3A, the power supply circuit 300B of FIG. 3B, or the power supply circuit 400 of FIG. 4).

The operations 600 may begin, at block 602, with the power supply circuit enabling a bypass mode for the power supply circuit. At block 604, the power supply circuit may, in response to the enablement at block 602, discharge a capacitor (e.g., capacitor Cboot) coupled across power supply inputs (e.g., power supply inputs coupled to power supply rail 314 and switching node 312) of a gate driver (e.g., gate driver 304) for driving a gate of a power transistor (e.g., power transistor Q2). At block 606, the power supply circuit (and more specifically logic, such as logic 306) may determine the capacitor has been discharged. At block 608, in response to the determination at block 606, the power supply circuit (and more specifically pullup circuitry such as pullup circuit 308) may pull up the gate of the power transistor to turn on the power transistor and enter the bypass mode for the power supply circuit.

According to certain aspects, the operations 600 may further involve activating a control signal (e.g., signal "cboot_eq_vsw") to effectively enable a current sink (e.g., level shifter 302 or current sink 318), such that the current sink begins discharging the capacitor.

According to certain aspects, the operations 600 may further involve activating a control signal (e.g., signal "cboot_eq_vsw") for a level shifter (e.g., level shifter 302), the capacitor being coupled across power supply inputs (e.g., power supply inputs coupled to power supply rail 314 and switching node 312) of the level shifter, such that the level shifter begins discharging the capacitor. In this case, the power supply circuit may also deactivate an input signal (e.g., signal "HSON") for the level shifter, in response to the enablement.

According to certain aspects, the operations 600 further involve turning on a reverse-blocking transistor (e.g., reverse-blocking transistor 222 in FIG. 2) coupled between an input power node (e.g., input power node 210 in FIG. 2) and a drain of the power transistor (e.g., coupled to "CHG_MID") to enter the bypass mode for the power supply circuit.

According to certain aspects, the operations 600 may further involve causing an output of the gate driver to enter a high impedance state based on the discharging at block 604 and before pulling up the gate of the power transistor at block 608.

According to certain aspects, the operations 600 may further involve activating an output signal (e.g., signal "cboot_eq_vsw") in response to the determination the capacitor has been discharged. In this case, pulling up the gate of the power transistor may involve enabling a pullup circuit (e.g., pullup circuit 308) to output a voltage to turn on the power transistor, based on the activated output signal.

For certain aspects, determining the capacitor has been discharged at block 606 may involve comparing a first voltage at a first terminal of the capacitor to a second voltage at a second terminal of the capacitor and determining the capacitor has been discharged when a difference between the first voltage and the second voltage is less than a threshold voltage. The first terminal of the capacitor may be coupled to a power supply rail (e.g., the power supply rail 314), and the second terminal of the capacitor may be coupled to a source of the power transistor (e.g., at the switching node 214 or 312).

According to certain aspects, the operations 600 may further involve the power supply circuit, in response to the enablement at block 602, opening a switch (e.g., battery switch 220 in FIG. 2) coupled between a first terminal of an inductor (e.g., inductor L1 in FIG. 2) and a node (e.g., node 230 in FIG. 2) for coupling to a battery (e.g., battery 228), a second terminal of the inductor being coupled to a source of the power transistor (e.g., at the switching node 214 or 312).

Figure 7:
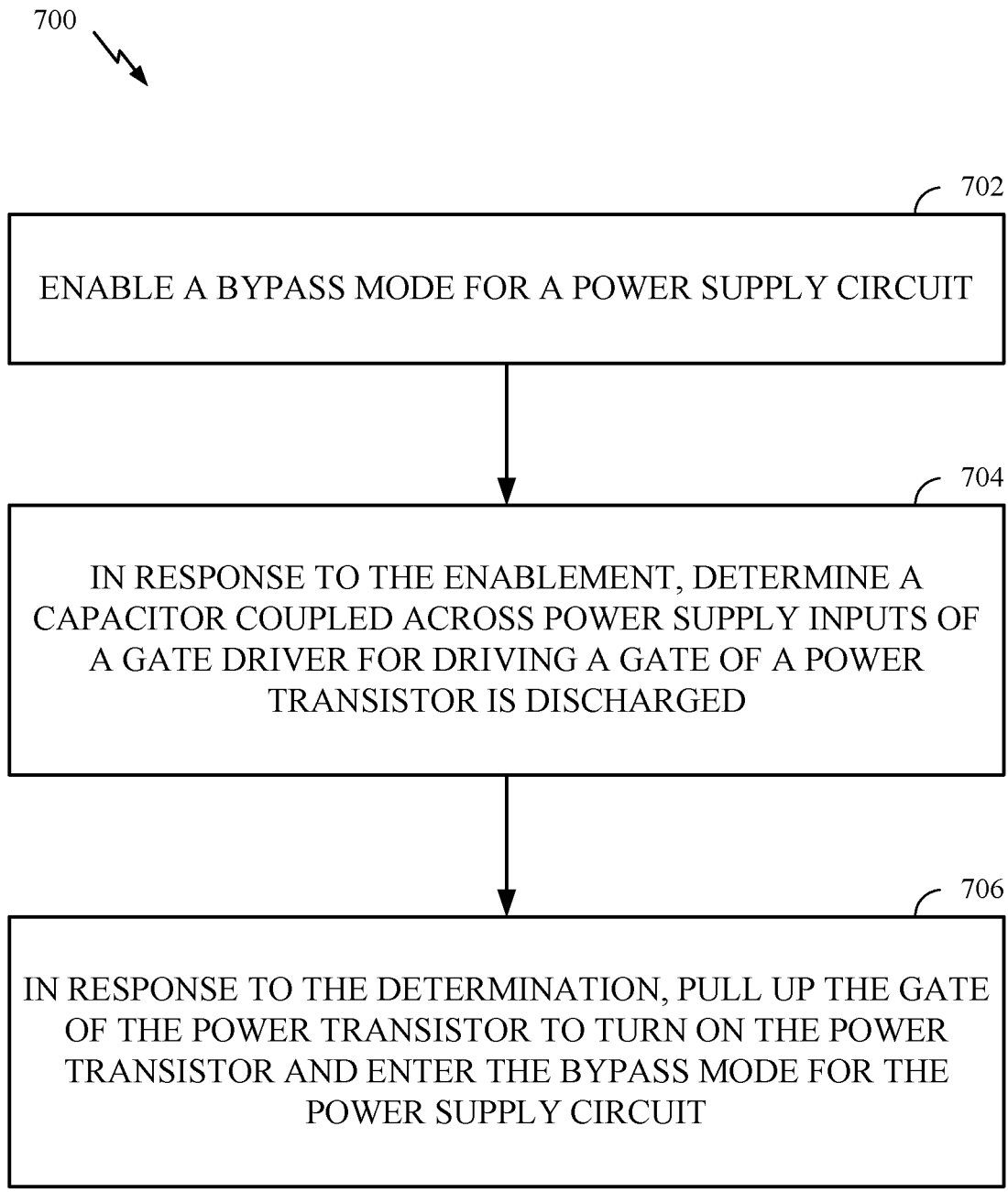

FIG. 7 is a flow diagram of example operations 700 for operating a power supply circuit, in accordance with certain aspects of the present disclosure. The operations 700 may be performed by a power supply circuit (e.g., the power supply circuit 300A of FIG. 3A, the power supply circuit 300B of FIG. 3B, or the power supply circuit 400 of FIG. 4).

The operations 700 may begin, at block 702, with the power supply circuit enabling a bypass mode for the power supply circuit. At block 704, in response to the enablement at block 702, the power supply circuit may determine a capacitor (e.g., capacitor Cboot) coupled across power supply inputs (e.g., power supply inputs coupled to power supply rail 314 and the switching node 312) of a gate driver (e.g., gate driver 304) for driving a gate of a power transistor (e.g., power transistor Q2) is discharged. At block 706, in response to the determination at block 704, the power supply circuit (and more specifically, a pullup circuit such as pullup circuit 308) may pull up the gate of the power transistor to turn on the power transistor and enter the bypass mode for the power supply circuit.

According to certain aspects, the operations 700 may further involve turning on a reverse-blocking transistor (e.g., reverse-blocking transistor 222 in FIG. 2) coupled between an input power node (e.g., input power node 210 in FIG. 2) and a drain of the power transistor to enter the bypass mode for the power supply circuit.

According to certain aspects, the operations 700 may further involve causing an output of the gate driver to enter a high impedance state based on the capacitor being discharged (e.g., as determined at block 704) and before pulling up the gate of the power transistor at block 706.

According to certain aspects, the operations 700 may further involve activating an output signal (e.g., signal "cboot_eq_vsw") in response to the determination at block 704. In this case, pulling up the gate of the power transistor at block 706 may include enabling a pullup circuit (e.g., pullup circuit 308) to output a voltage to turn on the power transistor, based on the activated output signal.

For certain aspects, determining the capacitor is discharged may involve comparing (for example, by logic such as logic 306) a first voltage at a first terminal of the capacitor to a second voltage at a second terminal of the capacitor and determining a difference between the first voltage and the second voltage is less than a threshold voltage. The first terminal of the capacitor may be coupled to a power supply rail (e.g., the power supply rail 314), and the second terminal of the capacitor may be coupled to a source of the power transistor (e.g., at the switching node 214 or 312).

Example Aspects

In addition to the various aspects described above, specific combinations of aspects are within the scope of the disclosure, some of which are detailed below:

Aspect 1: A power supply circuit comprising: a power transistor; a switching node coupled to a source of the power transistor; a power supply rail; a capacitor having a first terminal coupled to the power supply rail and having a second terminal coupled to the switching node; a gate driver having an output coupled to a gate of the power transistor, having a first power input coupled to the power supply rail, and having a second power input coupled to the switching node; logic having a first input coupled to the first terminal of the capacitor, having a second input coupled to the second terminal of the capacitor, and having a first output; and a pullup circuit having a control input coupled to a second output of the logic and having an output coupled to the gate of the power transistor.

Aspect 2: The power supply circuit of Aspect 1, further comprising a level shifter having a signal input, having a control input, having an output coupled to an input of the gate driver, having a first power input coupled to the power supply rail, and having a second power input coupled to the switching node, wherein: the first output of the logic is coupled to the control input of the level shifter; and during a bypass mode, the logic is configured to control the level shifter to discharge the capacitor and to enable the pullup circuit to output a voltage to turn on the power transistor, in response to the capacitor being discharged.

Aspect 3: The power supply circuit of Aspect 2, wherein the level shifter comprises a current sink and is configured to discharge the capacitor via the current sink when the control input of the level shifter is activated by the logic .

Aspect 4: The power supply circuit of Aspect 2 or 3, further comprising a reverse-blocking transistor coupled between an input power node and a drain of the power transistor, wherein the logic is configured to turn on the reverse-blocking transistor during the bypass mode, such that the input power node is effectively shorted to the switching node.

Aspect 5: The power supply circuit of any of the preceding Aspects, wherein the gate driver comprises: a first n-type transistor having a drain coupled to the output of the gate driver and having a source coupled to the second power input of the gate driver; a first p-type transistor having a drain coupled to the output of the gate driver and to the drain of the first n-type transistor; and a second p-type transistor having a source coupled to a source of the first p-type transistor and having a drain coupled to the first power input of the gate driver.

Aspect 6: The power supply circuit of Aspect 5, wherein the second p-type transistor is configured to be turned off when the capacitor is discharged and effectively put the output of the gate driver in a high impedance state.

Aspect 7: The power supply circuit of Aspect 5 or 6, wherein the gate driver further comprises a second n-type transistor having a drain coupled to a gate of the second p-type transistor, having a gate coupled to the power supply rail, and having a source coupled to the switching node.

Aspect 8: The power supply circuit of any of the preceding Aspects, wherein: the logic comprises a comparator having a first input coupled to the first terminal of the capacitor and having a second input coupled to the second terminal of the capacitor; the logic is configured to activate an output signal in response to the capacitor being discharged; and the logic is configured to enable the pullup circuit to output a voltage to turn on the power transistor, based on the activated output signal.

Aspect 9: The power supply circuit of Aspect 8, wherein the comparator comprises a Schmitt trigger.

Aspect 10: The power supply circuit of Aspect 9, wherein the comparator further comprises: a first transistor having a source coupled to the first terminal of the capacitor and having a drain coupled to a gate of the first transistor; a first current sink coupled between the drain of the first transistor and a reference potential node for the power supply circuit; a second transistor having a source coupled to the second terminal of the capacitor, having a gate coupled to the gate and the drain of the first transistor, and having a drain coupled to an input of the Schmitt trigger; and a second current sink coupled between the drain of the second transistor and the reference potential node.

Aspect 11: The power supply circuit of any of the preceding Aspects, wherein the pullup circuit has a power supply input coupled to another power supply rail configured to have a higher voltage than the power supply rail.

Aspect 12: The power supply circuit of Aspect 11, wherein the pullup circuit comprises: a current mirror having a first branch and a second branch, the first branch and the second branch being coupled to the power supply input of the pullup circuit; a first transistor having a source coupled to the second branch of the current mirror and having a drain coupled to the output of the pullup circuit; a second transistor having a drain coupled to the first branch of the current mirror and having a gate coupled to the control input of the pullup circuit; a first current sink coupled between a source of the second transistor and a reference potential node for the power supply circuit; a third transistor having a drain coupled to a gate of the first transistor and having a gate coupled to the control input of the pullup circuit; and a second current sink coupled between a source of the third transistor and the reference potential node for the power supply circuit.

Aspect 13: The power supply circuit of Aspect 12, wherein the pullup circuit further comprises a fourth transistor having a drain coupled to the power supply input of the pullup circuit, having a source coupled to the first branch and the second branch of the current mirror, and having a gate coupled to the gate of the first transistor and the drain of the third transistor.

Aspect 14: The power supply circuit of any of the preceding Aspects, further comprising a current sink selectively coupled to the first terminal of the capacitor, wherein during a bypass mode, the logic is configured to effectively enable the current sink, via the first output of the logic, to discharge the capacitor and to enable the pullup circuit to output a voltage to turn on the power transistor, in response to the capacitor being discharged.

Aspect 15: A battery charging circuit comprising the power supply circuit of any of the preceding Aspects, the battery charging circuit further comprising: an inductor having a first terminal coupled to the switching node; and a switch coupled between a second terminal of the inductor and a node for coupling to a battery.

Aspect 16: The battery charging circuit of Aspect 15, further comprising a level shifter having a signal input, having a control input, having an output coupled to an input of the gate driver, having a first power input coupled to the power supply rail, and having a second power input coupled to the switching node, wherein the first output of the logic is coupled to the control input of the level shifter, and wherein during a bypass mode, the logic is configured to: control the switch to open; control the level shifter to discharge the capacitor; and enable the pullup circuit to output a voltage to turn on the power transistor, in response to the capacitor being discharged.

Aspect 17: A method of operating a power supply circuit, comprising: enabling a bypass mode for the power supply circuit; in response to the enablement, discharging a capacitor coupled across power supply inputs of a gate driver for driving a gate of a power transistor; determining the capacitor has been discharged; and in response to the determination, pulling up the gate of the power transistor to turn on the power transistor and enter the bypass mode for the power supply circuit.

Aspect 18: The method of Aspect 17, further comprising activating a control signal to effectively enable a current sink, such that the current sink begins discharging the capacitor.

Aspect 19: The method of Aspect 17 or 18, further comprising activating a control signal for a level shifter, the capacitor being coupled across power supply inputs of the level shifter, such that the level shifter begins discharging the capacitor.

Aspect 20: The method of Aspect 19, further comprising deactivating an input signal for the level shifter, in response to the enablement.

Aspect 21: The method of any of Aspects 17 to 20, further comprising turning on a reverse-blocking transistor coupled between an input power node and a drain of the power transistor to enter the bypass mode for the power supply circuit.

Aspect 22: The method of any of Aspects 17 to 21, further comprising causing an output of the gate driver to enter a high impedance state based on the discharging and before pulling up the gate of the power transistor.

Aspect 23: The method of any of Aspects 17 to 22, further comprising activating an output signal in response to the determination the capacitor has been discharged, wherein pulling up the gate of the power transistor comprises enabling a pullup circuit to output a voltage to turn on the power transistor, based on the activated output signal.

Aspect 24: The method of any of Aspects 17 to 23, wherein determining the capacitor has been discharged comprises: comparing a first voltage at a first terminal of the capacitor to a second voltage at a second terminal of the capacitor, the first terminal of the capacitor being coupled to a power supply rail and the second terminal of the capacitor being coupled to a source of the power transistor; and determining the capacitor has been discharged when a difference between the first voltage and the second voltage is less than a threshold voltage.

Aspect 25: The method of any of Aspects 17 to 24, further comprising, in response to the enablement, opening a switch coupled between a first terminal of an inductor and a node for coupling to a battery, a second terminal of the inductor being coupled to a source of the power transistor.

Aspect 26: A method of operating a power supply circuit, comprising: enabling a bypass mode for the power supply circuit; in response to the enablement, determining a capacitor coupled across power supply inputs of a gate driver for driving a gate of a power transistor is discharged; and in response to the determination, pulling up the gate of the power transistor to turn on the power transistor and enter the bypass mode for the power supply circuit.

Aspect 27: The method of Aspect 26, further comprising turning on a reverse-blocking transistor coupled between an input power node and a drain of the power transistor to enter the bypass mode for the power supply circuit.

Aspect 28: The method of Aspect 26 or 27, further comprising causing an output of the gate driver to enter a high impedance state based on the capacitor being discharged and before pulling up the gate of the power transistor.

Aspect 29: The method of any of Aspects 26 to 28, further comprising activating an output signal in response to the determination, wherein pulling up the gate of the power transistor comprises enabling a pullup circuit to output a voltage to turn on the power transistor, based on the activated output signal.

Aspect 30: The method of any of Aspects 26 to 29, wherein determining the capacitor is discharged comprises: comparing a first voltage at a first terminal of the capacitor to a second voltage at a second terminal of the capacitor, the first terminal of the capacitor being coupled to a power supply rail and the second terminal of the capacitor being coupled to a source of the power transistor; and determining a difference between the first voltage and the second voltage is less than a threshold voltage.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A power supply circuit comprising:
   a power transistor;
   a switching node coupled to a source of the power transistor;
   a power supply rail;
   a capacitor having a first terminal coupled to the power supply rail and having a second terminal coupled to the switching node;
   a gate driver having an output coupled to a gate of the power transistor, having a first power input coupled to the power supply rail, and having a second power input coupled to the switching node;
   logic having a first input coupled to the first terminal of the capacitor, having a second input coupled to the second terminal of the capacitor, and having a first output; and
   a pullup circuit having a control input coupled to a second output of the logic and having an output coupled to the gate of the power transistor.

2. The power supply circuit of claim 1, further comprising a level shifter having a signal input, having a control input, having an output coupled to an input of the gate driver, having a first power input coupled to the power supply rail, and having a second power input coupled to the switching node, wherein:
   the first output of the logic is coupled to the control input of the level shifter; and
   during a bypass mode, the logic is configured to control the level shifter to discharge the capacitor and to enable the pullup circuit to output a voltage to turn on the power transistor, in response to the capacitor being discharged.

3. The power supply circuit of claim 2, wherein the level shifter comprises a current sink and is configured to discharge the capacitor via the current sink when the control input of the level shifter is activated by the logic.

4. The power supply circuit of claim 2, further comprising a reverse-blocking transistor coupled between an input power node and a drain of the power transistor, wherein the logic is configured to turn on the reverse-blocking transistor during the bypass mode, such that the input power node is effectively shorted to the switching node.

5. The power supply circuit of claim 1, wherein the gate driver comprises:
- a first n-type transistor having a drain coupled to the output of the gate driver and having a source coupled to the second power input of the gate driver;
- a first p-type transistor having a drain coupled to the output of the gate driver and to the drain of the first n-type transistor; and
- a second p-type transistor having a source coupled to a source of the first p-type transistor and having a drain coupled to the first power input of the gate driver.

6. The power supply circuit of claim 5, wherein the second p-type transistor is configured to be turned off when the capacitor is discharged and effectively put the output of the gate driver in a high impedance state.

7. The power supply circuit of claim 5, wherein the gate driver further comprises a second n-type transistor having a drain coupled to a gate of the second p-type transistor, having a gate coupled to the power supply rail, and having a source coupled to the switching node.

8. The power supply circuit of claim 1, wherein:
- the logic comprises a comparator having a first input coupled to the first terminal of the capacitor and having a second input coupled to the second terminal of the capacitor;
- the logic is configured to activate an output signal in response to the capacitor being discharged; and
- the logic is configured to enable the pullup circuit to output a voltage to turn on the power transistor, based on the activated output signal.

9. The power supply circuit of claim 8, wherein the comparator comprises a Schmitt trigger.

10. The power supply circuit of claim 9, wherein the comparator further comprises:
- a first transistor having a source coupled to the first terminal of the capacitor and having a drain coupled to a gate of the first transistor;
- a first current sink coupled between the drain of the first transistor and a reference potential node for the power supply circuit;
- a second transistor having a source coupled to the second terminal of the capacitor, having a gate coupled to the gate and the drain of the first transistor, and having a drain coupled to an input of the Schmitt trigger; and
- a second current sink coupled between the drain of the second transistor and the reference potential node.

11. The power supply circuit of claim 1, wherein the pullup circuit has a power supply input coupled to another power supply rail configured to have a higher voltage than the power supply rail.

12. The power supply circuit of claim 11, wherein the pullup circuit comprises:
- a current mirror having a first branch and a second branch, the first branch and the second branch being coupled to the power supply input of the pullup circuit;
- a first transistor having a source coupled to the second branch of the current mirror and having a drain coupled to the output of the pullup circuit;
- a second transistor having a drain coupled to the first branch of the current mirror and having a gate coupled to the control input of the pullup circuit;
- a first current sink coupled between a source of the second transistor and a reference potential node for the power supply circuit;
- a third transistor having a drain coupled to a gate of the first transistor and having a gate coupled to the control input of the pullup circuit; and
- a second current sink coupled between a source of the third transistor and the reference potential node for the power supply circuit.

13. The power supply circuit of claim 12, wherein the pullup circuit further comprises a fourth transistor having a drain coupled to the power supply input of the pullup circuit, having a source coupled to the first branch and the second branch of the current mirror, and having a gate coupled to the gate of the first transistor and the drain of the third transistor.

14. The power supply circuit of claim 1, further comprising a current sink selectively coupled to the first terminal of the capacitor, wherein during a bypass mode, the logic is configured to effectively enable the current sink, via the first output of the logic, to discharge the capacitor and to enable the pullup circuit to output a voltage to turn on the power transistor, in response to the capacitor being discharged.

15. A battery charging circuit comprising the power supply circuit of claim 1, the battery charging circuit further comprising:
- an inductor having a first terminal coupled to the switching node; and
- a switch coupled between a second terminal of the inductor and a node for coupling to a battery.

16. The battery charging circuit of claim 15, further comprising a level shifter having a signal input, having a control input, having an output coupled to an input of the gate driver, having a first power input coupled to the power supply rail, and having a second power input coupled to the switching node, wherein the first output of the logic is coupled to the control input of the level shifter, and wherein during a bypass mode, the logic is configured to:
- control the switch to open;
- control the level shifter to discharge the capacitor; and
- enable the pullup circuit to output a voltage to turn on the power transistor, in response to the capacitor being discharged.

17. A method of operating a power supply circuit, comprising:
- enabling a bypass mode for the power supply circuit;
- in response to the enablement, discharging a capacitor coupled across power supply inputs of a gate driver for driving a gate of a power transistor;
- determining the capacitor has been discharged; and
- in response to the determination, pulling up the gate of the power transistor to turn on the power transistor and enter the bypass mode for the power supply circuit.

18. The method of claim 17, further comprising activating a control signal to effectively enable a current sink, such that the current sink begins discharging the capacitor.

19. The method of claim 17, further comprising activating a control signal for a level shifter, the capacitor being coupled across power supply inputs of the level shifter, such that the level shifter begins discharging the capacitor.

20. The method of claim 19, further comprising deactivating an input signal for the level shifter, in response to the enablement.

21. The method of claim 17, further comprising turning on a reverse-blocking transistor coupled between an input power node and a drain of the power transistor to enter the bypass mode for the power supply circuit.

22. The method of claim 17, further comprising causing an output of the gate driver to enter a high impedance state based on the discharging and before pulling up the gate of the power transistor.

23. The method of claim 17, further comprising activating an output signal in response to the determination the capacitor has been discharged, wherein pulling up the gate of the power transistor comprises enabling a pullup circuit to output a voltage to turn on the power transistor, based on the activated output signal.

24. The method of claim 17, wherein determining the capacitor has been discharged comprises:
   comparing a first voltage at a first terminal of the capacitor to a second voltage at a second terminal of the capacitor, the first terminal of the capacitor being coupled to a power supply rail and the second terminal of the capacitor being coupled to a source of the power transistor; and
   determining the capacitor has been discharged when a difference between the first voltage and the second voltage is less than a threshold voltage.

25. The method of claim 17, further comprising, in response to the enablement, opening a switch coupled between a first terminal of an inductor and a node for coupling to a battery, a second terminal of the inductor being coupled to a source of the power transistor.

26. A method of operating a power supply circuit, comprising:
   enabling a bypass mode for the power supply circuit;
   in response to the enablement, determining a capacitor coupled across power supply inputs of a gate driver for driving a gate of a power transistor is discharged; and
   in response to the determination, pulling up the gate of the power transistor to turn on the power transistor and enter the bypass mode for the power supply circuit.

27. The method of claim 26, further comprising turning on a reverse-blocking transistor coupled between an input power node and a drain of the power transistor to enter the bypass mode for the power supply circuit.

28. The method of claim 26, further comprising causing an output of the gate driver to enter a high impedance state based on the capacitor being discharged and before pulling up the gate of the power transistor.

29. The method of claim 26, further comprising activating an output signal in response to the determination, wherein pulling up the gate of the power transistor comprises enabling a pullup circuit to output a voltage to turn on the power transistor, based on the activated output signal.

30. The method of claim 26, wherein determining the capacitor is discharged comprises:
   comparing a first voltage at a first terminal of the capacitor to a second voltage at a second terminal of the capacitor, the first terminal of the capacitor being coupled to a power supply rail and the second terminal of the capacitor being coupled to a source of the power transistor; and
   determining a difference between the first voltage and the second voltage is less than a threshold voltage.

* * * * *